US006468591B1

(12) United States Patent
Paranthaman et al.

(10) Patent No.: US 6,468,591 B1
(45) Date of Patent: Oct. 22, 2002

(54) METHOD FOR MAKING MGO BUFFER LAYERS ON ROLLED NICKEL OR COPPER AS SUPERCONDUCTOR SUBSTRATES

(75) Inventors: Mariappan Paranthaman, Knoxville, TN (US); Amit Goyal, Knoxville, TN (US); Donald M. Kroeger, Knoxville, TN (US); Frederic A. List, III, Andersonville, TN (US)

(73) Assignee: UT-Battelle, LLC ( * ) Notice: Subject to any disclaimer, the term of this patent is extended or adjusted under 35 U.S.C. 154(b) by 0 days.

(21) Appl. No.: 09/405,871

(22) Filed: Sep. 24, 1999

Related U.S. Application Data

(62) Division of application No. 09/096,558, filed on Jun. 12, 1998, now Pat. No. 6,261,704.

(51) Int. Cl.[7] ................................. B05D 1/36
(52) U.S. Cl. ....................... 427/404; 427/402; 427/405; 427/419.1; 427/419.2
(58) Field of Search ............................. 427/402, 404, 427/405, 419.1, 419.2

(56) References Cited

U.S. PATENT DOCUMENTS 5,741,377 A    4/1998  Goyal et al. ............... 148/512
  898,020 A  * 4/1999  Goyal et al.

OTHER PUBLICATIONS

U.S. patent application Ser. No. 08/670,871, Budri et al., filed Jun. 26, 1996.
U.S. patent application Ser. No. 09/096,558, Paranthaman et al., filed Jun. 12, 1998.
X. O. Wu, S. R. Foltyn, P. Arendt, N. Townsend, C. Adams, C. H. Campbell P. T. Wari, Y. Golter, and D. E. Peterson, Appl. Phys. Lett. 65 (15) Oct. 10, 1994, p. 1961.
M. Paranthaman, et al Physica C 125 (1997) 266–272 (No month).
C. Prouteau, J. F. Hamet, B. Mercery, M. Hervieu, B. Raveau, D. Robbes, L. Coudrier, and G. Ben, "Significant improvement of superconductivity of laser ablated YBa2Cu3O7/MgO thin films: Introduction of a SrTiO3 buffer layer," Physica C, vol. 248, 108–118 (1995) (No month).
Chunyan Tian, Yang Du, and Siu–Wai Chan: "Epitaxial formation and characterization of CeO2 films." MRS proceeding vol. 355 on Evolution of Thin Film and Surface Structure and Morphology edited by B. G. Demczyk, E. D. Williams, E. Garfunkel, B. M. Clemens, J. J. Cuomo, 1995. ISDN: 155899–256–1. (No month).
Wei–Yung Hsu, and Rishi Raj: "MgO epitaxial thin films on (100) GaAs as a substrate for the growth of oriented PbTiO3," Appl. Phys. Lett., vol. 60, Jun. 1992, pp. 3105–3107.

* cited by examiner

Primary Examiner—Archene Turner
(74) Attorney, Agent, or Firm—Joseph A. Marasco; J. Kenneth Davis

(57) ABSTRACT

Buffer layer architectures are epitaxially deposited on biaxially-textured rolled-Ni and/or Cu substrates for high current conductors, and more particularly buffer layer architectures such as MgO/Ag/Pt/Ni, MgO/Ag/Pd/Ni, MgO/Ag/Ni, MgO/Ag/Pd/Cu, MgO/Ag/Pt/Cu, and MgO/Ag/Cu. Techniques used to deposit these buffer layers include electron beam evaporation, thermal evaporation, rf magnetron sputtering, pulsed laser deposition, metal-organic chemical vapor deposition (MOCVD), combustion CVD, and spray pyrolysis.

3 Claims, 2 Drawing Sheets

METHOD FOR MAKING MGO BUFFER LAYERS ON ROLLED NICKEL OR COPPER AS SUPERCONDUCTOR SUBSTRATES

This application claims the benefit of Korean Application No. 57556/1997, filed Nov. 1, 1997, in the Korean Patent Office, the disclosure of which is incorporated herein by reference.

CROSS-REFERENCE TO RELATED APPLICATIONS

This Patent Application is a Divisional Application of U.S. patent application Ser. No. 09/096,558 now U.S. Pat. No. 6,261,704 "MgO Buffer Layes on Rolled Nickel or Copper as Superconductor Substrates", filed Jun. 12, 1998. The present invention relates to issued U.S. Pat. No. 5,741,377 "Structures Having Enhanced Biaxial Texture and Method of Fabricating Same" by Goyal et al., filed Apr. 10, 1995 and issued Apr. 21, 1998; pending U.S. patent application Ser. No. 08/670,871 "High Tc YBCO Superconductor Deposited on Biaxially Textured Ni Substrate" by Budai et al., filed Jun. 26, 1996; and U.S. Patent Application Ser. No. 09/096,559 "Buffer Layers on Rolled Nickel or Copper as Superconductor Substrates" by Paranthaman, Goyal, Kroeger and Lee, also filed on Jun. 12, 1998, all of which are hereby incorporated in their entirety by reference.

FIELD OF THE INVENTION

The present invention relates to structures upon which high current conductors may be deposited and methods for fabricating said structures, and more particularly to buffer layer architectures such as MgO/Ag/Pt/Ni, MgO/Ag/Pd/Ni, MgO/Ag/Ni, MgO/Ag/Pd/Cu, MgO/Ag/Pt/Cu, and MgO/Ag/Cu, MgO/Pt/Ni, MgO/Pd/Ni, MgO/Pt/Cu, and MgO/Pd/Cu.

BACKGROUND OF THE INVENTION

It has long been desired to grow biaxially oriented oxide buffer layers other than $CeO_2$ directly on textured-Ni substrates. Also it has been desired to provide an alternative to pulsed laser deposition processes that may be easier to scale up for producing thick buffer layers.

Recent developments in deposited conductors, both rolling assisted biaxially textured substrates (RABiTS), and ion-beam assisted deposition (IBAD) based on $YBa_2Cu_3O_7$ superconductors are promising, especially superconductors deposited on buffered substrates.

The "deposited conductor" approach described herein is useful for growing superconductors such as $REBa_2Cu_3O_7$, $(Bi,Pb)_2Sr_2Ca_{n-1}Cu_nO_{2n+4}$ (n=1–3), $Tl_1Ba_2Ca_{n-1}Cu_nO_{2n+3}$ (n=1–4), $Tl_2Ba_2Ca_{n-1}Cu_nO_{2n+4}$(n=1–3), and $Hg_1Ba_2Ca_{n-1}Cu_nO_{2n+2+\beta}$(n=1–4) with high critical-current densities. These high $J_c$ conductors will be suitable for transmission lines and various other applications.

This invention opens up a wide variety of possibilities of growing several other buffer layers such as $SrTiO_3$, $LaAlO_3$, $REAlO_3$ (RE=Rare Earth), $BaZrO_3$, and $CaZrO_3$ on either buffered-rolled metal substrates or directly on rolled metal substrates. The demonstrated buffer layers may also be useful for photovoltaics, ferroelectrics, sensors, and electro-optic applications The following sections of publications also relate to the present invention, and are hereby incorporated by reference:

X. D. Wu, S. R. Foltyn, P. Arendt, J. Townsend, C. Adams, I. H. Campbell, P. Tiwari, Y. Coulter, and D. E. Peterson, Appl. Phys. Lett. 65 (15), Oct. 10, 1994, p1961.

M. Paranthaman et al., Physica C 275 (1997) 266–272.

C. Prouteau, J. F. Hamet, B. Mercery, M. Hervieu, B. Raveau, D. Robbes, L. Coudrier, and G. Ben, "Significant improvement of superconductivity of laser ablated $YBa_2Cu_3O_7$/MgO" thin films: Introduction of a $SrTiO_3$ buffer layer," Physica C, Vol. 248, 108–118 (1995)

Chunyan Tian, Yang Du, and Siu-Wai Chan: "Epitaxial formation and characterization of $CeO_2$ films." MRS proceeding Vol 355 on Evolution of Thin Film and Surface Structure and Morphology edited by B. G. Demczyk, E. D. Williams, E. Gatfunkel, B. M. Clemens, J. J. Cuomo, 1995. ISDN: 155899-256-1.

Wei-Yung Hsu, and Rishi Raj: "MgO epitaxial thin films on (100) GaAs as a substrate for the growth of oriented $PbTiO_3$," Appl. Phys. Lett., Vol. 60, June 1992, pp.3105–3107.

OBJECTS OF THE INVENTION

Accordingly, it is an object of the present invention to provide new and improved biaxially oriented MgO buffer layers on textured substrates comprising Ni.

It is another object to provide an alternative to pulsed laser deposition processes that may be easier to scale up for producing thick buffer layers.

Further and other objects will become apparent from the description contained herein.

SUMMARY OF THE INVENTION

In accordance with one aspect of the present invention, the foregoing and other objects are achieved by a biaxially textured article which comprises: a substrate which comprises at least one metal selected from the group consisting of Ni and Cu, the substrate having a surface exhibiting biaxial texture; a first buffer layer selected from the group consisting of Pd and Pt, the first buffer layer being epitaxially disposed upon the biaxially-textured surface of the Ni; a second buffer layer which comprises Ag, the second buffer layer being epitaxially disposed upon the biaxially textured surface of the first buffer layer; and a third buffer layer which comprises MgO epitaxially disposed upon the biaxially textured surface of the Ag.

In accordance with a second aspect of the present invention, the foregoing and other objects are achieved by a method for making a biaxially textured article which comprises the steps of: providing a substrate which comprises at least one metal selected from the group consisting of Ni and Cu, the substrate having a surface exhibiting biaxial texture; epitaxially depositing upon the biaxially textured surface of the Ni a first buffer layer selected from the group consisting of Pd and Pt; epitaxially depositing upon the biaxially textured surface of the first buffer layer a second buffer layer comprising Ag; and epitaxially depositing upon the biaxially textured surface of the Ag a third buffer layer comprising MgO.

In accordance with a third aspect of the present invention, the foregoing and other objects are achieved by a biaxially textured article which comprises: a substrate which comprises at least one metal selected from the group consisting of Ni and Cu, the substrate having a surface exhibiting biaxial texture; a first buffer layer which comprises Ag, the first buffer layer being epitaxially disposed upon the biaxially textured surface of the substrate; and a second buffer layer which comprises MgO epitaxially disposed upon the biaxially textured surface of the Ag.

In accordance with a fourth aspect of the present invention, the foregoing and other objects are achieved by a method for making a biaxially textured article which comprises the steps of: providing a substrate which comprises at least one metal selected from the group consisting of Ni and Cu, the substrate having a surface exhibiting biaxial texture; epitaxially depositing upon the biaxially textured surface of the substrate a first buffer layer which comprises Ag; and epitaxially depositing upon the biaxially textured surface of the Ag a second buffer layer which comprises MgO.

For a better understanding of the present invention, together with other and further objects, advantages and capabilities thereof, reference is made to the following disclosure and appended claims in connection with the above-described drawings.

DETAILED DESCRIPTION OF THE INVENTION

This invention describes how to clean as-rolled Ni and Cu substrates and grow biaxially oriented buffer layers directly on them. Buffer layers of MgO were deposited on RABiTS by vacuum processing techniques such as electron-beam evaporation and rf magnetron sputtering.

The biaxially textured Ni substrates can be cleaned either by annealing in high vacuum greater than $10^{-6}$ Torr at temperatures ranging from 400 to 1300° C. or by annealing in reducing atmospheres before and during the deposition of the films, herein called buffer layers or films interchangeably. These procedures can remove carbon and sulfur that are present in the bulk material and also any NiO present at the surface. Some of the buffer layers grown provide excellent diffusion barriers for Ni and Cu and also are chemically compatible with high temperature superconductors. Buffer layer combinations included epitaxial laminate of MgO/Ag/Pt/Ni and MgO/Ag/Pd/Ni. Both Pd and Pt films were grown epitaxially on the biaxially textured Ni metal. The Ag films were grown on Pd-and Pt-buffered Ni substrates followed by in situ epitaxial growth of MgO. The crystallographic orientation of the Ag and MgO were mostly (100). The methods described above can also be used to produce the same buffer layers or films on Cu as well as on alloys of Cu and/or Ni.

EXAMPLE

Figure 1:
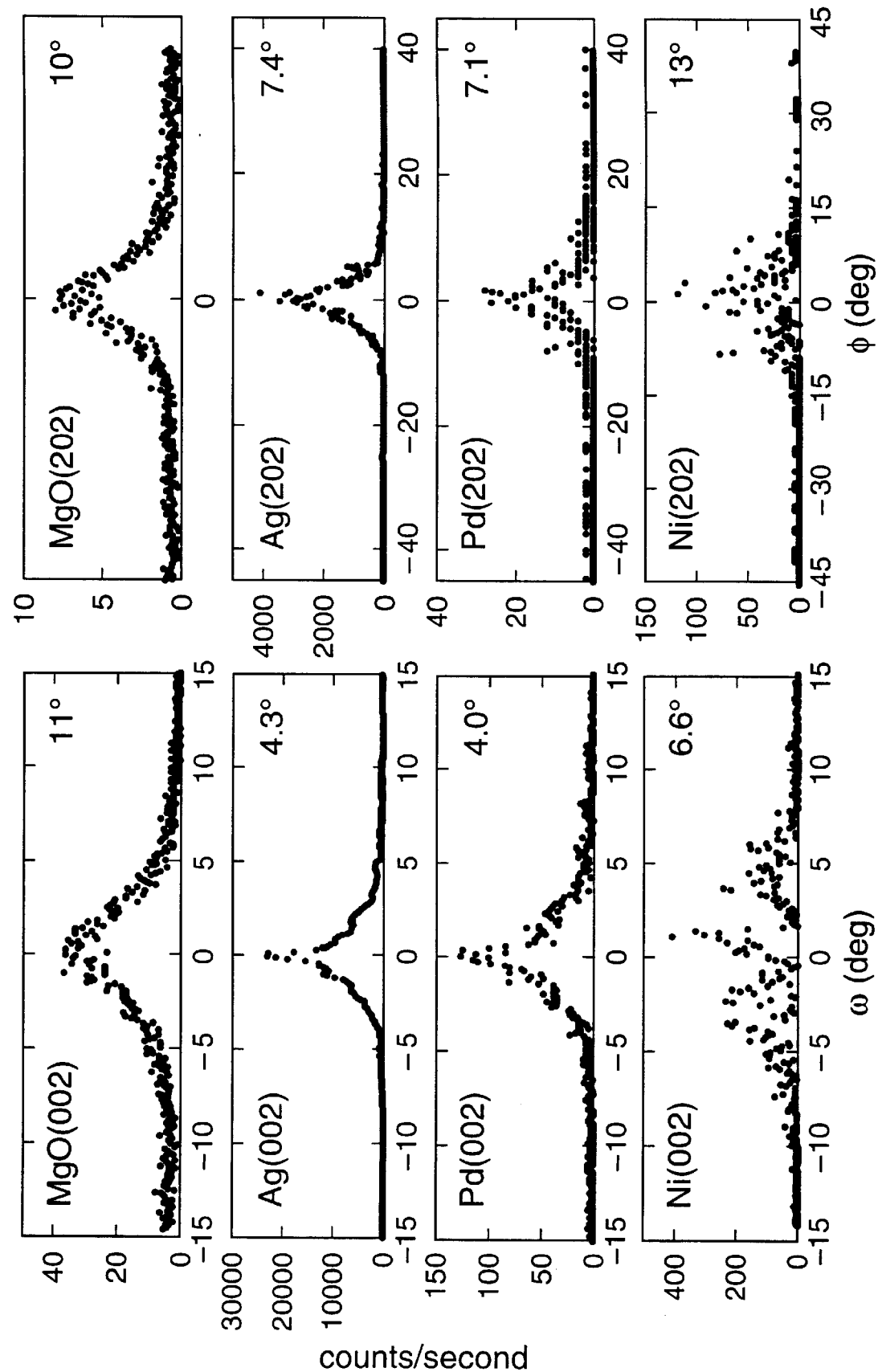
FIG. 1 shows the $\omega$ and $\phi$ scans for post-annealed MgO (200 nm thick) on Ag—Pd-buffered Ni.
Figure 2:
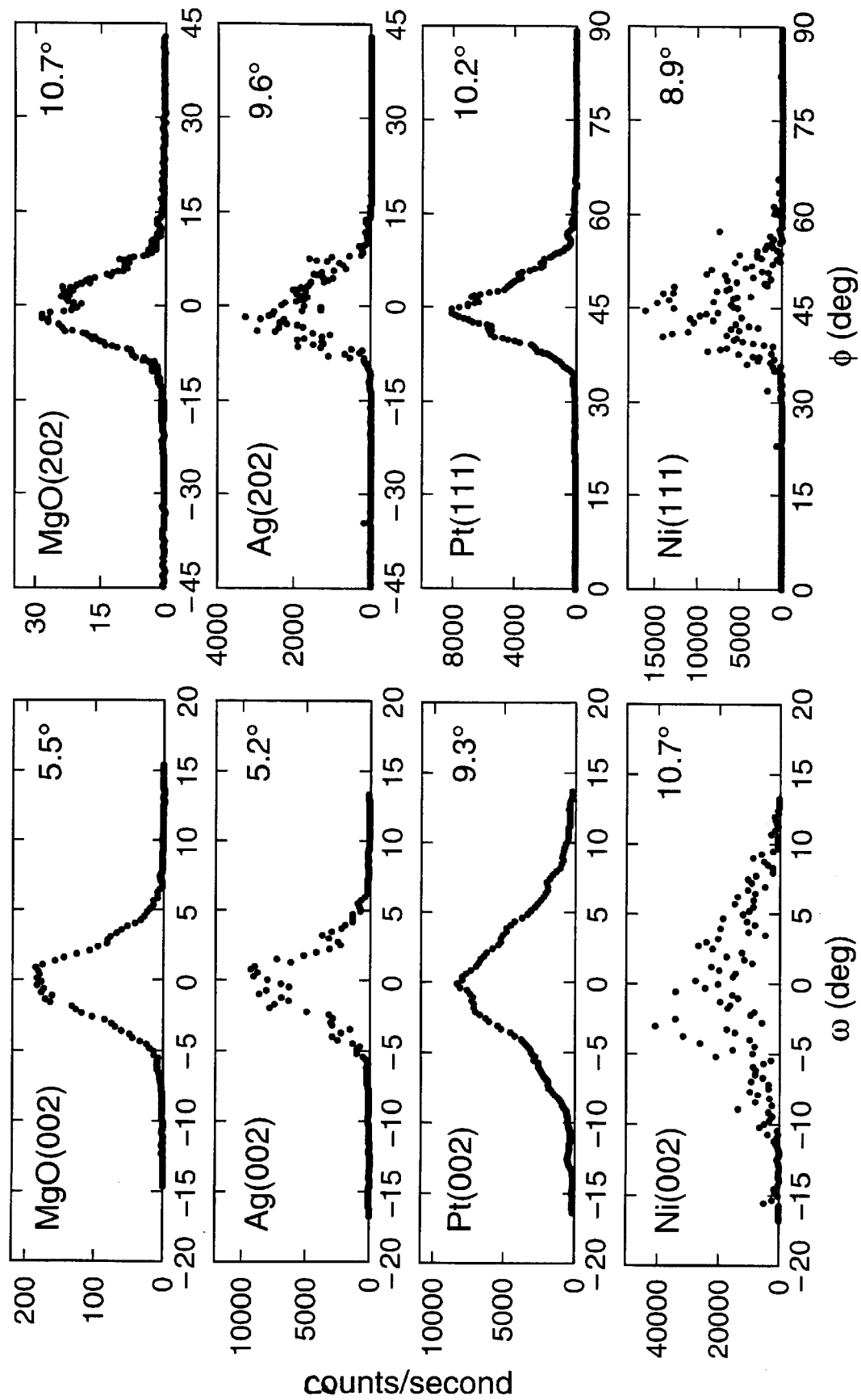
FIG. 2 shows the $\omega$ and $\phi$ scans for post-annealed MgO (200 nm thick) on Ag—Pt-buffered Ni.

Growth of MgO on RABiTS-Ag Substrates by e-beam evaporation AR/Pd(Pt)/Ni Architecture This process explains how Pd and/or Pt layers were grown directly on Ni, followed by both Ag and MgO. Hence the layer sequence is MgO/Ag/Pd/Ni or MgO/Ag/Pt/Ni. The biaxially oriented Ni substrates were cleaned ultrasonically with both acetone and methanol, and mounted on a substrate holder with a heater assembly in the e-beam system. After the vacuum had reached $1\times10^{-6}$ Torr at room temperature, the substrates were in situ annealed at 400° C. for 4 hours. The temperature of the substrate was measured using a thermocouple. Then the Pd and/or Pt layers were grown on textured Ni at temperatures between 100 and 500° C. The deposition rate for Pd was between 5 and 10 Å/sec with the pressure of $10^{-6}$ Torr, and the final thickness varied from 200 nm to 1 micron. The thickness of the film was measured by a quartz crystal monitor during the deposition. A four circle diffractometer was used to collect pole figures, to measure rocking curves ($\omega$ scan) of (002) planes of the (001) textured film which analyze the out-of-plane alignment, and to measure the $\phi$ scans of the (202) planes which analyze in-plane alignment of the film. FIG. 1 shows the $\omega$ and $\phi$ scans for as-deposited Pd (400 nm thick) on Ni at 500° C. The Full-Width-Half-Maximum (FWHM) for Ni (002) and Pd (002) are 6.6° and 4.0°, and that of Ni (202) and Pd (202) are 13.0° and 7.1°, respectively. From FIG. 1, it can be concluded that Pd can be grown epitaxially on Ni. The deposition for Pt was 3–5 Å/sec, and the final thickness was 200 nm. The Pt was also grown epitaxially on Ni by using similar conditions as those for Pd. FIG. 2 shows the $\omega$ and $\phi$ scans for as-deposited Pt (200 nm thick) on in situ 400° C. annealed Ni at 500° C. The FWHM for Ni (002) and Pt (002) are 10.7° and 9.3°, and that of Ni (111) and Pt (111) are 8.9° and 10.2° respectively. This is an example where Pt was grown epitaxially on Ni.

The Ag films were grown on both Pd-buffered Ni and Pt-buffered Ni substrates at room temperature. Initially, Pd- and Pt-buffered Ni substrates were heated to 300° C. in $1\times10^{-6}$ Torr vacuum to remove any surface contamination present, and then the temperature was decreased to room temperature. The Ag films were grown at room temperature with the deposition rate of 5 Å/sec, and the final thickness was varied from 150 to 500 nm thick. Then the substrates were heated to 300° C. for a few minutes, and then the substrates were removed after cooling to room temperature. The $\theta$–$2\theta$ scans for a 150-nm-thick Ag film deposited on both Pd-buffered and Pt-buffered Ni showed the presence of a (100)-oriented film. FIG. 1 shows the $\omega$ and $\phi$ scans for 150 mn thick post-annealed Ag on Pd-buffered Ni. The FWHM for Ag (002) is 4.3° and that of Ag (202) is 7.4°, respectively. FIG. 2 show shows the $\omega$ and $\phi$ scans for 150-nm-thick post-annealed Ag on Pt-buffered Ni. The FWHM for Ag (002) is 5°, and that of Ag (202) is 9.6°, respectively. The rocking curves for Pd, Pt, and Ag are smooth because these are fine-grained films. The Ni substrate, by contrast, is coarse grained, so its rocking curves (FIGS. 1 and 2) consist of many sharp peaks corresponding to individual grains. The XRD results show that Ag, Pt, and Pd can be deposited epitaxially on Ni by the e-beam evaporation technique. Similar results were also obtained by dc sputtering. The methods described above can also be used to produce the same buffer layers or films on Cu as well as on alloys of Cu and/or Ni.

MgO/Ag/Pd(Pt)/Ni Architecture

The MgO layers were deposited on Ag-Pt-buffered or Ag-Pd-buffered Ni substrates at room temperature using e-beam evaporation followed by in-situ post-annealing up to 300° C. MgO was used as the source. The deposition rate was between 5 and 10 Å/sec at $1\times10^{-5}$ Torr vacuum with the total thickness of 200 nm. FIG. 1 shows the $\omega$ and $\phi$ scans for post-annealed MgO (200 nm thick) on Ag-Pd-buffered Ni. The FWHM for MgO (002) and Ag (002) are 11° and 4.3°, and that of MgO (202) and Ag (202) are 10° and 7.4° respectively. FIG. 2 shows the $\omega$ and $\phi$ scans for post-annealed MgO (200nm thick) on Ag–Pt-buffered Ni. The FWHM for MgO (002) and Ag (002) are 5.5° and 5.2°, and that of MgO (202) and Ag (202) are 10.7° and 9.6° respectively. FIGS. 1 and 2 prove that the MgO films grown on Ag-buffered substrates are biaxially oriented.

Although this invention demonstrates the epitaxy of MgO layers on rolled-Ni substrates with or without additional buffer layers, similar processing conditions may be used to grow other buffer layers such as $REAlO_3$ (RE =Rare Earth), AEZrO$_3$ (AE =Alkaline Earth), and any other compatible buffer layers on these rolled substrates. Other metallic substrates may also be used for growing these buffer layers.

For purposes herein, the following definitions apply: Biaxial(ly) Texture: The films are oriented in both out-of-plane (along the (001) direction) and in plane (along the (100) direction) directions.

Epitaxial(ly): The films grown on a particular substrate will grow in the same orientation of the substrate is defined as epitaxial, for example, cube-on-cube orientation. Thus, a buffer layer as described herein as having been epitaxially deposited upon a biaxially-textured surface also exhibits a biaxially textured surface. The methods described above can also be used to produce the same buffer layers or films on Cu as well as on alloys of Cu and/or Ni.

Various techniques which can be used to deposit these buffer layers or films include but are not limited to: electron beam evaporation, thermal evaporation, rf magnetron sputtering, pulsed laser deposition, metal-organic chemical vapor deposition (MOCVD), combustion CVD, and spray pyrolysis.

While there has been shown and described what are at present considered the preferred embodiments of the invention, it will be obvious to those skilled in the art that various changes and modifications can be made therein without departing from the scope of the inventions defined by the appended claims.

We claim:

1. A method for making a biaxially textured article comprising Me steps of:
   a. providing a substrate comprising at least one metal selected from the group consisting of Ni and Cu, the substrate having a surface exhibiting biaxial texture;
   b. epitaxially depositing upon the biaxially textured surfce of the substrate a first buffer layer selected from the group consisting of Pd and Pt;
   c. epitaxially depositing upon the biaxially textured surface of the first buffer layer a second buffer layer comprising Ag;
   d. epitially depositing upon the biaxially textured surface of tie Ag, by electron beam evaporation at room temperature, a third buffer layer comprising MgO; and
   e. postannealing the article at a temperature up to about 300° C. so that said MgO buffer layer is characterized by an x-ray diffraction phi scan peak of no more than 11° FWHM.

2. A method for making a biaxially textured article comprising the steps of:
   a. providing a substrate comprising at least one metal selected iom the group consisting of Ni and Cu, the substrate having a surface exhibiting biaxial texture;
   b. epitaxially depositing upon the biaxially textured surface of the substrate a first buffer layer comprising Ag;
   c. epitaxially depositing upon the biaxially textured surface of the Ag, by electron beam evaporation at room temperature, a second buffer layer comprising MgO; and
   d. post-annealing the article at a temperature up to about 300° C. so that said MgO buffer layer is characterized by an x-ray diffraction phi scan peak of no more than 11° FWHM.

3. A method for making a biaxially textured article comprising the steps of:
   a. providing a substrate comprising at least one metal selected from the group consisting of Ni and Cu, the substrate having a surface exhibiting biaxial texture;
   b. epitaxially depositing upon the biaxially textured surface of the substrate a first buffer layer selected from the group consisting of Pd and Pt;
   c. epitaxially depositing upon the biaxially textured surface of the first buffer layer, by electron beam evaporation at room temperature a second buffer layer comprising MgD; and
   d. post-annealing the article at a temperature up to about p300° C. so that said MgO buffer layer is characterized by an x-ray diffraction phi scan peak of no more than 11° FWHM.

\* \* \* \* \*